(12) United States Patent
Tian et al.

(10) Patent No.: US 12,615,038 B2
(45) Date of Patent: Apr. 28, 2026

(54) DYNAMIC D FLIP-FLOP, REGISTER, CHIP, AND DATA PROCESSING APPARATUS

(71) Applicant: SHENZHEN MICROBT ELECTRONICS TECHNOLOGY CO., LTD., Guangdong (CN)

(72) Inventors: Wenbo Tian, Guangdong (CN); Zhijun Fan, Guangdong (CN); Chao Xu, Guangdong (CN); Ke Xue, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 25 days.

(21) Appl. No.: 18/032,896

(22) PCT Filed: Aug. 18, 2021

(86) PCT No.: PCT/CN2021/113230
§ 371 (c)(1),
(2) Date: Apr. 20, 2023

(87) PCT Pub. No.: WO2022/121365
PCT Pub. Date: Jun. 16, 2022

(65) Prior Publication Data
US 2023/0396242 A1     Dec. 7, 2023

(30) Foreign Application Priority Data
Dec. 9, 2020    (CN) .......................... 202011428628.3

(51) Int. Cl.
| | |
|---|---|
| *H03K 3/012* | (2006.01) |
| *H03K 3/356* | (2006.01) |
| *H03K 3/3562* | (2006.01) |

(52) U.S. Cl.
CPC ....... *H03K 3/356043* (2013.01); *H03K 3/012* (2013.01); *H03K 3/3562* (2013.01)

(58) Field of Classification Search
None
See application file for complete search history.

(56) References Cited

U.S. PATENT DOCUMENTS

| | | | |
|---|---|---|---|
| 5,576,997 A | 11/1996 | Masuda et al. | |
| 8,880,965 B2 * | 11/2014 | Zhang ............ | G01R 31/318541 |
| | | | 714/724 |

(Continued)

FOREIGN PATENT DOCUMENTS

| | | |
|---|---|---|
| CN | 110311655 A | 10/2019 |
| CN | 110633104 A | 12/2019 |

(Continued)

OTHER PUBLICATIONS

International Search Report for PCT/CN2021/113230 mailed on Oct. 28, 2021 (5 pages including English Translation).

(Continued)

*Primary Examiner* — Jeffrey S Zweizig
(74) *Attorney, Agent, or Firm* — Merchant & Gould P.C.

(57)     ABSTRACT

The present disclosure relates to a dynamic D flip-flop, a register, a chip, and a data processing apparatus. A dynamic D flip-flop is provided, including: an input terminal, configured to receive input data; an output terminal, configured to provide output data in response to the input data; clock signal terminal(s), configured to receive clock signal(s); a first latch unit, configured to latch the input data from the input terminal and transmit the input data under control of the clock signal(s); and a second latch unit, configured to latch data from the first latch unit and transmit the data latched by the first latch unit under control of the clock signal(s), where the first latch unit and the second latch unit are sequentially connected in series between the input ter- (Continued)

400 minal and the output terminal, and where the output terminal is configured to use data from the second latch unit as the output data for outputting.

13 Claims, 12 Drawing Sheets

(56) References Cited

U.S. PATENT DOCUMENTS

| 8,941,429 | B2 * | 1/2015 | Cheng | H03K 3/35625 |
| | | | | 327/210 |
| 8,994,405 | B1 * | 3/2015 | Suzuki | H03K 19/00315 |
| | | | | 326/98 |
| 9,755,623 | B2 * | 9/2017 | Cheng | H03K 3/35625 |
| 10,659,017 | B1 * | 5/2020 | Rengarajan | H03K 3/0372 |
| 10,715,119 | B2 * | 7/2020 | Mao | H03K 3/35625 |
| 11,251,781 | B2 * | 2/2022 | Liu | H03K 19/0016 |
| 11,316,692 | B2 * | 4/2022 | Wentz | H04L 9/3221 |
| 11,714,125 | B2 * | 8/2023 | Dia | H03K 3/037 |
| | | | | 714/727 |
| 2008/0186070 | A1 * | 8/2008 | Iyer | H03K 3/35606 |
| | | | | 327/202 |
| 2018/0123568 | A1 | 5/2018 | Rasouli et al. | |
| 2018/0183441 | A1 | 6/2018 | Ryu et al. | |
| 2019/0372563 | A1 | 12/2019 | Mao | |
| 2022/0116027 | A1 | 4/2022 | Liu et al. | |
| 2023/0238947 | A1 * | 7/2023 | Tian | H03K 3/35625 |
| | | | | 327/218 |

FOREIGN PATENT DOCUMENTS

| CN | 110635786 | A | 12/2019 |
| CN | 110677141 | A | 1/2020 |
| CN | 110708041 | A | 1/2020 |
| CN | 111600577 | A | 8/2020 |
| CN | 212726968 | U | 3/2021 |
| CN | 214154471 | U | 9/2021 |
| KR | 10-2005-0078560 | A | 8/2005 |
| KR | 20070070426 | A | 7/2007 |
| KR | 10-1849923 | B1 | 4/2018 |
| WO | 2020001167 | A1 | 1/2020 |

OTHER PUBLICATIONS

Written Opinion for PCT/CN2021/113230 mailed on Oct. 28, 2021 (7 pages including English Translation).

First TW Office Action with Search Report for Patent Application No. 110130454 (16 pages including English Translation).

TW Rejection Decision for Patent Application No. 110130454 (7 pages including English Translation).

First Chinese Office Action for Application No. 202022933930.6 dated May 21, 2021 (4 pages including English Translation).

First Office Action dated Aug. 26, 2024 for corresponding KR Application No. 10-2023-7018359 (25 pages including English Translation).

Office Action dated Jan. 5, 2025 for corresponding CN Application No. 202011428628.3 (34 pages including English Translation).

* cited by examiner

100

200

400

400

DYNAMIC D FLIP-FLOP, REGISTER, CHIP, AND DATA PROCESSING APPARATUS

CROSS-REFERENCE TO RELATED APPLICATIONS

This application is a National Stage Application of International Application No. PCT/CN2021/113230, filed 18 Aug. 2021, which claims benefit of Serial No. 202011428628.3, filed 9 Dec. 2020 in China, and which applications are incorporated herein by reference. To the extent appropriate, a claim of priority is made to each of the above disclosed applications.

TECHNICAL FIELD

The present disclosure generally relates to a dynamic D flip-flop, a register, a chip, and a data processing apparatus.

BACKGROUND

Bitcoin is a kind of virtual encrypted digital currency in the peer-to-peer (P2P) form, and the unique feature thereof is that the bitcoin is not issued with relying on a specific currency institution, but is generated through a large quantity of computations based on a particular algorithm. In a bitcoin transaction, a distributed database including many nodes in the entire P2P network is used to confirm and record all transaction behaviors, and a cryptographic design is used to ensure security.

Bitcoin miners used to perform mining through central processing unit (CPU) products. However, because mining is a computing-intensive application, and with the gradual increase of the quantity of miners and the gradual increase of the difficulty of equipment performance improvement, it is nearly unproductive or even negative to use CPUs for mining. Nowadays, most miners start to use mining equipment using an application specific chip (application specific integrated circuit (ASIC)), a field programmable gate array (FPGA), or the like to improve mining efficiency.

The core of using a mining machine to perform bitcoin mining is to obtain rewards based on the computing power of the mining machine to calculate SHA-256. For the mining machine, the chip size, chip running speed, and chip power consumption are three crucial factors that determine the performance of the mining machine. The chip size determines the cost of the chip; the running speed of the chip determines the running speed, namely, the computing power, of the mining machine; and the power consumption of the chip determines the degree of power consumption, that is, the cost of mining. In practical applications, a very important performance indicator for measuring the mining machine is the power consumed per unit computing power, that is, a ratio of power consumption to computing power.

The mining process requires a large quantity of repetitive logical computations, which requires the use of a large quantity of D flip-flops. Improper selection of D flip-flops will lead to an increased chip area, a lower computing speed, and increased power consumption, which finally results in a worse ratio of power consumption to computing power of the mining machine.

The D flip-flop has a wide range of applications, and may be used as a register, a shift register, frequency division, a waveform generator, or the like of a digital signal. The D flip-flop has two inputs: data (D) and clock (CLK), and has one output (Q). Data may be written into the D flip-flop or data may be read from the D flip-flop.

SUMMARY

According to a first aspect of the present disclosure, a dynamic D flip-flop is provided, which includes: an input terminal, configured to receive input data; an output terminal, configured to provide output data in response to the input data; clock signal terminal(s), configured to receive clock signal(s); a first latch unit, configured to latch the input data from the input terminal and transmit the input data under control of the clock signal(s); and a second latch unit, configured to latch data from the first latch unit and transmit the data latched by the first latch unit under control of the clock signal(s), wherein the first latch unit and the second latch unit are sequentially connected in series between the input terminal and the output terminal, and wherein the output terminal is configured to use data from the second latch unit as the output data for outputting.

According to a second aspect of the present disclosure, a register is provided, which includes: a plurality of input terminals, configured to receive input data; a plurality of output terminals, configured to output data; a clock signal terminal, configured to receive an external clock signal; and a clock buffer, configured to provide control clock signals to a plurality of dynamic D flip-flops based on the external clock signal, wherein the control clock signals includes a first clock signal and a second clock signal, the first clock signal is inverted from the second clock signal, and the plurality of dynamic D flip-flops are connected in parallel between the plurality of input terminals and the plurality of output terminals, and configured to latch and/or read data under control of the control clock signals, wherein the dynamic D flip-flop is the dynamic D flip-flop described above.

According to a third aspect of the present disclosure, a chip is provided, which includes the dynamic D flip-flop described above or the register described above.

According to a fourth aspect of the present disclosure, a data processing apparatus is provided, which is configured to execute a digital currency encryption algorithm, and includes the chip described above.

Through the following detailed description of exemplary embodiments of the present disclosure with reference to the accompanying drawings, other features and advantages of the present disclosure will become clear.

BRIEF DESCRIPTION OF THE DRAWINGS

The accompanying drawings constituting a part of the description illustrate embodiments of the present disclosure, and are used to explain the principle of the present disclosure together with the description.

The present disclosure may be understood more clearly based on the following detailed description with reference to the accompanying drawings.

Figure 1:
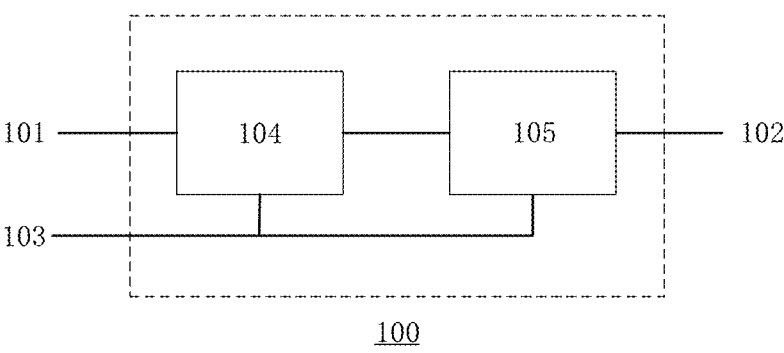
FIG. 1 shows a dynamic D flip-flop according to some embodiments of the present disclosure.

It is to be noted that in the following implementations illustrated, sometimes the same reference numeral is used in different accompanying drawings to represent the same part or a part with the same function, and repeated illustration thereof is omitted. In the present description, similar reference signs or letters are used for indicating similar items. Therefore, once an item is defined in one accompanying drawing, the item does not need to be further discussed in the subsequent accompanying drawings.

For ease of understanding, sometimes the position, size, range and the like of each structure shown in the accompanying drawings may not indicate the actual position, size, range and the like. Therefore, the present disclosure is not limited to the position, size, range and the like disclosed in the accompanying drawings. In addition, the accompanying drawings are not necessarily drawn in proportion, and some features may be enlarged to show details of the particular component.

DETAILED DESCRIPTION

Various exemplary embodiments of the present disclosure will be described in detail with reference to the accompanying drawings. It should be noted that unless illustrated in detail otherwise, the relative deployment of the components and steps, the numerical expression and the values stated in these embodiments do not limit the scope of the present disclosure.

In fact, the following description of at least one exemplary embodiment is merely illustrative, and is not as any limitation to the present disclosure and to application or use thereof. In other words, the circuits and methods herein are shown in an exemplary manner to illustrate different embodiments of the circuits or methods in the present disclosure, but are not intended to limit the present disclosure. One skilled in the art will understand that they merely illustrate exemplary manners by which the present disclosure may be implemented rather than exhaustive manners.

Technologies, methods, and devices known to person(s) of ordinary skill in the art may not be discussed in detail, but in proper circumstances, the technologies, methods, and devices shall be regarded as a part of the granted description.

A computing device for mining virtual currency needs to perform a large quantity of repetitive logic computations in the mining process, which requires a large quantity of D flip-flops for data storage. Therefore, the performance of the D flip-flops directly affects the performance of a computing chip, including an area, power consumption, and a computing speed of the chip.

A conventional D flip-flop includes a relatively large quantity of PMOS transistors and NMOS transistors, which will occupy a relatively large area on the chip and correspondingly bring relatively high power consumption. Therefore, simplified D flip-flops including a relatively small quantity of transistors are required to reduce the chip area and power consumption.

To resolve the foregoing problem, the present disclosure provides a simplified dynamic D flip-flop for a computing device and a register including a plurality of dynamic D flip-flops connected in parallel, thereby effectively reducing the area and power consumption.

Compared with a static D flip-flop, in the dynamic D flip-flop, a positive feedback circuit configured to maintain an operating state is reduced, so that the circuit structure will be greatly simplified. In this way, both the chip area and the power consumption are reduced. A conventional dynamic D flip-flop usually includes an input drive unit, two stages of latch units, and an output drive unit. The applicant proposes a novel dynamic D flip-flop in the previously submitted patent document CN111600577A, in which the input drive unit is omitted to reduce the chip area and power consumption. To further reduce the chip area and power consumption, the present disclosure proposes a more simplified dynamic D flip-flop for an application environment with a relatively small driving load, which only includes two stages of latch units, and does not include an output drive unit. Because the output drive unit is omitted, the chip area and power consumption can be further effectively reduced, which is very important for a virtual currency computing device using a large quantity of dynamic D flip-flops.

FIG. 1 shows a dynamic D flip-flop according to some embodiments of the present disclosure. The dynamic D flip-flop 100 includes: an input terminal 101, configured to receive input data; an output terminal 102, configured to provide output data in response to the input data; a clock signal terminal 103, configured to receive a clock signal; a first latch unit 104, configured to latch the input data from the input terminal 101 and transmit the input data under control of the clock signal; and a second latch unit 105, configured to latch data from the first latch unit 104 and transmit the data latched by the first latch unit 104 under control of the clock signal, wherein the first latch unit 104 and the second latch unit 105 are sequentially connected in series between the input terminal 101 and the output terminal 102, and wherein the output terminal 102 is configured to use data from the second latch unit 105 as the output data for outputting.

Figure 2:
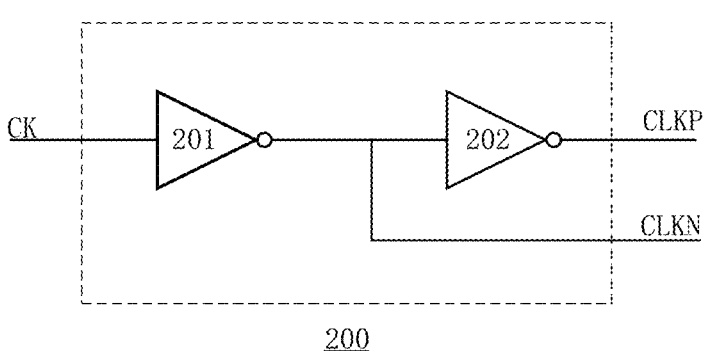
FIG. 2 shows a clock buffer for a dynamic D flip-flop according to some embodiments of the present disclosure.

FIG. 2 shows a clock buffer configured to provide clock signals of a dynamic D flip-flop. The clock buffer 200 includes two stages of inverters 201 and 202 connected in series. The inverters 201 and 202 respectively generate a clock signal CLKN and a clock signal CLKP inverted from the clock signal CLKN for controlling the dynamic D flip-flop. The clock buffer 200 buffers an inputted clock signal CK, and provides the clock signal CLKN and the clock signal CLKP to the dynamic D flip-flop. In a non-limiting example, only 2 inverters are shown in FIG. 2. Certainly, the clock buffer 200 may include more inverters.

Figure 3:
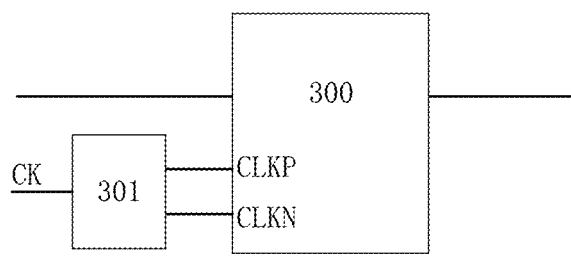
FIG. 3 shows a dynamic D flip-flop containing clock control according to some embodiments of the present disclosure.

FIG. 3 shows a dynamic D flip-flop 300 containing clock controlling. As shown in FIG. 3, after the clock signal CK is buffered through the clock buffer 301, the clock signals CLKN and CLKP are provided to the dynamic D flip-flop 300.

Figure 4A:
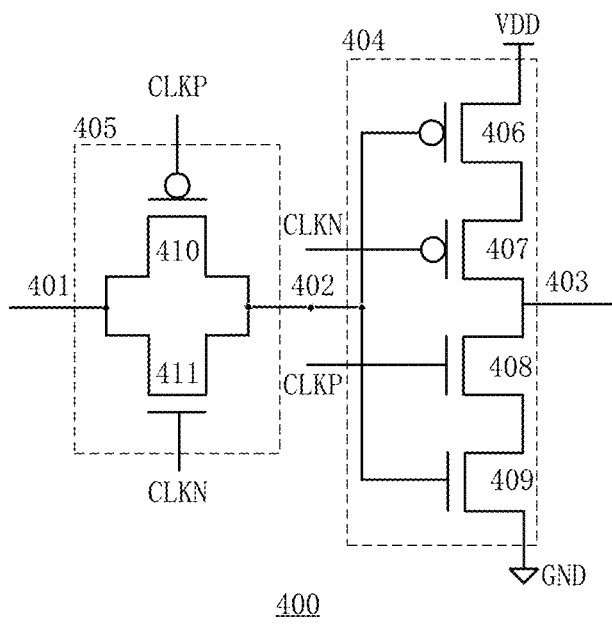
FIG. 4A and FIG. 4B respectively show schematic circuit diagrams of dynamic D flip-flops according to some embodiments of the present disclosure.

FIG. 4A shows a schematic circuit diagram of a dynamic D flip-flop according to some embodiments of the present disclosure. The dynamic D flip-flop 400 may include a first latch unit 405 and a second latch unit 404. At a node 401 as an input terminal of the dynamic D flip-flop 400, the first latch unit 405 may receive input data; at a node 402 as an output terminal of the first latch unit 405, the first latch unit

405 may transmit data latched by the first latch unit 405 to the second latch unit 404; and at a node 403 as an output terminal of the second latch unit 404, the second latch unit 404 may provide output data.

In the embodiment shown in FIG. 4A, the first latch unit 405 may be a transmission gate. As shown in FIG. 4A, the first latch unit 405 may include a third PMOS transistor 410 and a third NMOS transistor 411, wherein the third PMOS transistor 410 and the third NMOS transistor 411 may be connected in parallel between the input terminal of the dynamic D flip-flop 400 and the output terminal of the first latch unit 405.

As shown in FIG. 4A, a source of the third PMOS transistor 410 may be connected to a source of the third NMOS transistor 411, to form an input terminal of the first latch unit 405; and a drain of the third PMOS transistor 410 may be connected to a drain of the third NMOS transistor 411, to form the output terminal of the first latch unit 405. A gate of the third PMOS transistor 410 may be controlled by the clock signal CLKP, and a gate of the third NMOS transistor 411 may be controlled by the clock signal CLKN.

When CLKN is at a low level, CLKP is at a high level, and both the third PMOS transistor 410 and the third NMOS transistor 411 are in an off state. In this case, a high-impedance state is present between the input terminal and the output terminal of the first latch unit 405, the first latch unit 405 is off, and the input data at the node 401 cannot pass through the first latch unit 405. When CLKN is at a high level, CLKP is at a low level, and at least one of the third PMOS transistor 410 and the third NMOS transistor 411 is in an on state. In this case, the first latch unit 405 is on, the input data at the node 401 is transmitted to the node 402 through the first latch unit 405, and the data at the node 402 is rewritten.

In an alternative embodiment, because the transmission gate may be symmetrical, the sources and drains of the transistors of the transmission gate may be interchanged. That is, the drain of the third PMOS transistor 410 may be connected to the drain of the third NMOS transistor 411, to form the input terminal of the first latch unit 405; and the source of the third PMOS transistor 410 may be connected to the source of the third NMOS transistor 411, to form the output terminal of the first latch unit 405.

However, in some cases, for example, when the sources of the transistors of the transmission gate are connected to a substrate, the sources and drains of the transistors of the transmission gate are not interchangeable.

In the embodiment shown in FIG. 4A, the second latch unit 404 may be a triple gate. As shown in FIG. 4A, the second latch unit 404 may include a first PMOS transistor 406, a second PMOS transistor 407, a first NMOS transistor 408, and a second NMOS transistor 409, wherein the first PMOS transistor 406, the second PMOS transistor 407, the first NMOS transistor 408, and the second NMOS transistor 409 are sequentially connected in series between a power supply VDD and ground GND.

As shown in FIG. 4A, a source of the first PMOS transistor 406 may be connected to the power supply VDD, a source of the second PMOS transistor 407 may be connected to a drain of the first PMOS transistor 406, a drain of the first NMOS transistor 408 may be connected to a drain of the second PMOS transistor 407, a drain of the second NMOS transistor 409 may be connected to a source of the first NMOS transistor 408, and a source of the second NMOS transistor 409 may be connected to the ground GND, wherein the drain of the second PMOS transistor 407 may be connected to the drain of the first NMOS transistor 408, to form an output terminal of the second latch unit 404. A gate of the first PMOS transistor 406 may be connected to a gate of the second NMOS transistor 409, to form an input terminal of the second latch unit 404. The input terminal is connected to the output terminal of the first latch unit 405, so that the gate of the first PMOS transistor 406 and the gate of the second NMOS transistor 409 can be controlled by an output of the first latch unit 405. A gate of the second PMOS transistor 407 may be controlled by the clock signal CLKN, and a gate of the first NMOS transistor 408 may be controlled by the clock signal CLKP.

When CLKN is at a low level, CLKP is at a high level, and both the second PMOS transistor 407 and the first NMOS transistor 408 are in an on state. In this case, the second latch unit 404 is in an on state, and transmits the data at the node 402 to the node 403 in an inverted manner, to rewrite the data at the node 403. When CLKN is at a high level, CLKP is at a low level, and both the second PMOS transistor 407 and the first NMOS transistor 408 are in an off state. In this case, the second latch unit 404 is in a high-impedance state, and the data outputted by the first latch unit 405 at the node 402 cannot pass through the second latch unit 404. Because the data at the node 402 cannot pass through the second latch unit 404, the data at the node 402 can be latched at the node 402 to maintain the original state and play a role of data registering.

As shown in FIG. 4A, the output drive unit is omitted for the dynamic D flip-flop 400, and the output terminal of the dynamic D flip-flop 400 is configured to use data from the second latch unit 404 as output data for outputting. Due to an inverting effect of the second latch unit 404, the output data at the node 403 is inverted from the input data at the node 401 for the dynamic D flip-flop 400.

Compared with a conventional dynamic D flip-flop including the output drive unit, transistor(s) of the output drive unit is(are) omitted for the dynamic D flip-flop shown in FIG. 4A, and only 6 transistors are required, which thereby greatly reduces the chip area. Due to the reduction of one stage of inverter output stage, power consumption will also be reduced. The advantageous technical effect is also applicable to the dynamic D flip-flops shown in FIG. 4B, FIG. 6A, and FIG. 6B below.

Because the output drive unit is omitted for the dynamic D flip-flop shown in FIG. 4A, and the load is driven by a triple gate, the dynamic D flip-flop shown in FIG. 4A is especially suitable for cases in which a large driving load is not required.

Figure 4B:
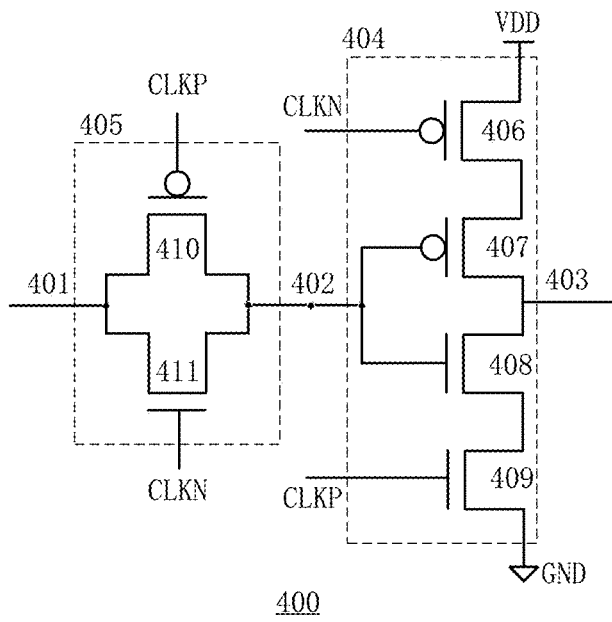

FIG. 4B shows a schematic circuit diagram of a dynamic D flip-flop according to some embodiments of the present disclosure.

In the embodiment shown in FIG. 4B, the first latch unit 405 may be a transmission gate. As shown in FIG. 4B, the first latch unit 405 may include a third PMOS transistor 410 and a third NMOS transistor 411, wherein the third PMOS transistor 410 and the third NMOS transistor 411 may be connected in parallel between the input terminal of the dynamic D flip-flop 400 and the output terminal of the first latch unit 405.

As shown in FIG. 4B, a source of the third PMOS transistor 410 may be connected to a source of the third NMOS transistor 411, to form an input terminal of the first latch unit 405; and a drain of the third PMOS transistor 410 may be connected to a drain of the third NMOS transistor 411, to form the output terminal of the first latch unit 405. A gate of the third PMOS transistor 410 may be controlled by the clock signal CLKP, and a gate of the third NMOS transistor 411 may be controlled by the clock signal CLKN.

When CLKN is at a low level, CLKP is at a high level, and both the third PMOS transistor 410 and the third NMOS transistor 411 are in an off state. In this case, a high-impedance state is present between the input terminal and the output terminal of the first latch unit 405, the first latch unit 405 is off, and the input data at the node 401 cannot pass through the first latch unit 405. When CLKN is at a high level, CLKP is at a low level, and at least one of the third PMOS transistor 410 and the third NMOS transistor 411 is in an on state. In this case, the first latch unit 405 is on, the input data at the node 401 is transmitted to the node 402 through the first latch unit 405, and the data at the node 402 is rewritten.

In an alternative embodiment, because the transmission gate may be symmetrical, the sources and drains of the transistors of the transmission gate may be interchanged. That is, the drain of the third PMOS transistor 410 may be connected to the drain of the third NMOS transistor 411, to form the input terminal of the first latch unit 405; and the source of the third PMOS transistor 410 may be connected to the source of the third NMOS transistor 411, to form the output terminal of the first latch unit 405.

However, in some cases, for example, when the sources of the transistors of the transmission gate are connected to a substrate, the sources and drains of the transistors of the transmission gate are not interchangeable.

In the embodiment shown in FIG. 4B, the second latch unit 404 may be a triple gate. As shown in FIG. 4B, the second latch unit 404 may include a first PMOS transistor 406, a second PMOS transistor 407, a first NMOS transistor 408, and a second NMOS transistor 409, wherein the first PMOS transistor 406, the second PMOS transistor 407, the first NMOS transistor 408, and the second NMOS transistor 409 are sequentially connected in series between a power supply VDD and ground GND.

As shown in FIG. 4B, a source of the first PMOS transistor 406 may be connected to the power supply VDD, a source of the second PMOS transistor 407 may be connected to a drain of the first PMOS transistor 406, a drain of the first NMOS transistor 408 may be connected to a drain of the second PMOS transistor 407, a drain of the second NMOS transistor 409 may be connected to a source of the first NMOS transistor 408, and a source of the second NMOS transistor 409 may be connected to the ground GND, wherein the drain of the second PMOS transistor 407 may be connected to the drain of the first NMOS transistor 408, to form an output terminal of the second latch unit 404. A gate of the second PMOS transistor 407 may be connected to a gate of the first NMOS transistor 408, to form an input terminal of the second latch unit 404. The input terminal is connected to the output terminal of the first latch unit 405, so that the gate of the second PMOS transistor 407 and the gate of the first NMOS transistor 408 can be controlled by an output of the first latch unit 405. A gate of the first PMOS transistor 406 may be controlled by the clock signal CLKN, and a gate of the second NMOS transistor 409 may be controlled by the clock signal CLKP.

When CLKN is at a low level, CLKP is at a high level, and both the first PMOS transistor 406 and the second NMOS transistor 409 are in an on state. In this case, the second latch unit 404 is in an on state, and transmits the data at the node 402 to the node 403 in an inverted manner, to rewrite the data at the node 403. When CLKN is at a high level, CLKP is at a low level, and both the first PMOS transistor 406 and the second NMOS transistor 409 are in an off state. In this case, the second latch unit 404 is in a high-impedance state, and the data outputted by the first latch unit 405 at the node

402 cannot pass through the second latch unit 404. Because the data at the node 402 cannot pass through the second latch unit 404, the data at the node 402 can be latched at the node 402 to maintain the original state and play a role of data registering.

As shown in FIG. 4B, the output drive unit is omitted for the dynamic D flip-flop 400, and the output terminal of the dynamic D flip-flop 400 is configured to use data from the second latch unit 404 as output data for outputting. Due to an inverting effect of the second latch unit 404, the output data at the node 403 is inverted from the input data at the node 401 for the dynamic D flip-flop 400.

The dynamic D flip-flop shown in FIG. 4B is a variation of the dynamic D flip-flop shown in FIG. 4A, and the difference lies in the different positions of clock-controlled transistors in the second latch unit 404.

Figure 5:
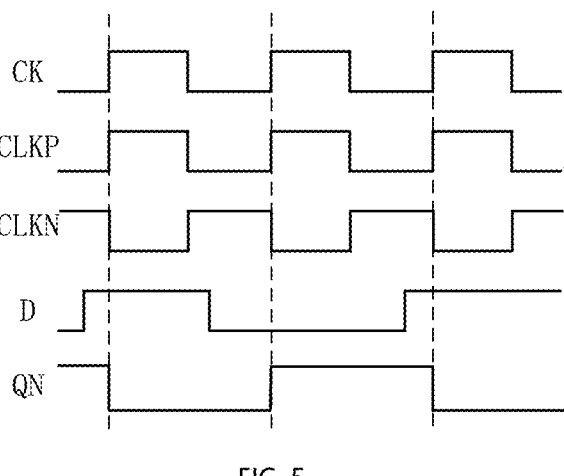
FIG. 5 shows a circuit time sequence diagram of the dynamic D flip-flops shown in FIG. 4A and FIG. 4B.

FIG. 5 shows a circuit time sequence diagram of the dynamic D flip-flops which are active at rising edges shown in FIG. 4A and FIG. 4B. A detailed description is provided below according to the working principle of the dynamic D flip-flops with reference to FIG. 5.

As shown in FIG. 5, when CK is at a low level, CLKP is at a low level, and CLKN is at a high level. For the dynamic D flip-flop shown in FIG. 4A, in this case, the first latch unit 405 is in an on state, and the input data at the input terminal of the dynamic D flip-flop 400 is stored to the node 402 through the first latch unit 405. In this case, the transistors controlled by the clock signals CLKN and CLKP in the second latch unit 404 are in an off state, the second latch unit 404 is in a high-impedance state, and the data at the node 402 cannot pass through the second latch unit 404. The data at the node 403 can be latched at the node 403 to maintain the original state and play a role of data registering. In this case, the output of the dynamic D flip-flop 400 maintains the original state.

Subsequently, as shown in FIG. 5, when a rising edge of CK comes, CLKP jumps to a high level, and CLKN jumps to a low level. For the dynamic D flip-flop shown in FIG. 4A, in this case, the first latch unit 405 is in an off state, the input data at the input terminal cannot pass through the first latch unit 405, and the data at the node 402 maintains the original state. In this case, the transistors controlled by the clock signals CLKN and CLKP in the second latch unit 404 are in an on state, the second latch unit 404 is on, and transmits the data at the node 402 to the node 403 in an inverted manner and outputs it. It can be seen that when the rising edge of the clock signal CK comes, the output state of the dynamic D flip-flop changes. Due to an inverting effect of the second latch unit 404, the output data at the node 403 of the dynamic D flip-flop 400 is inverted from the input data at the node 401 of the dynamic D flip-flop 400. Therefore, as shown in FIG. 5, when the rising edge of CK comes, the output terminal QN jumps to 0 in a case that the input terminal D is 1, and the output terminal QN jumps to 1 in a case that the input terminal D is 0.

As shown in FIG. 5, when CK is at a low level, CLKP is at a low level, and CLKN is at a high level. For the dynamic D flip-flop shown in FIG. 4B, in this case, the first latch unit 405 is in an on state, and the input data at the input terminal of the dynamic D flip-flop 400 is stored to the node 402 through the first latch unit 405. In this case, the transistors controlled by the clock signals CLKN and CLKP in the second latch unit 404 are in an off state, the second latch unit 404 is in a high-impedance state, and the data at the node 402 cannot pass through the second latch unit 404. The data at the node 403 can be latched at the node 403 to maintain the original state and play a role of data registering. In this case, the output of the dynamic D flip-flop 400 maintains the original state.

Subsequently, as shown in FIG. 5, when a rising edge of CK comes, CLKP jumps to a high level, and CLKN jumps to a low level. For the dynamic D flip-flop shown in FIG. 4B, in this case, the first latch unit 405 is in an off state, the input data at the input terminal cannot pass through the first latch unit 405, and the data at the node 402 maintains the original state. In this case, the transistors controlled by the clock signals CLKN and CLKP in the second latch unit 404 are in an on state, the second latch unit 404 is on, and transmits the data at the node 402 to the node 403 in an inverted manner and outputs it. It can be seen that when the rising edge of the clock signal CK comes, the output state of the dynamic D flip-flop changes. Due to an inverting effect of the second latch unit 404, the output data at the node 403 of the dynamic D flip-flop 400 is inverted from the input data at the node 401 of the dynamic D flip-flop 400. Therefore, as shown in FIG. 5, when the rising edge of CK comes, the output terminal QN jumps to 0 in a case that the input terminal D is 1, and the output terminal QN jumps to 1 in a case that the input terminal D is 0.

Figure 6A:
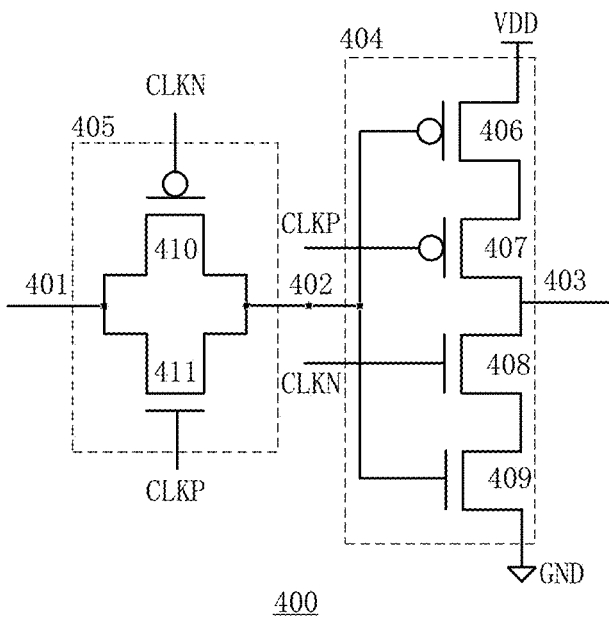
FIG. 6A and FIG. 6B respectively show schematic circuit diagrams of variant dynamic D flip-flops according to some embodiments of the present disclosure.
Figure 6B:
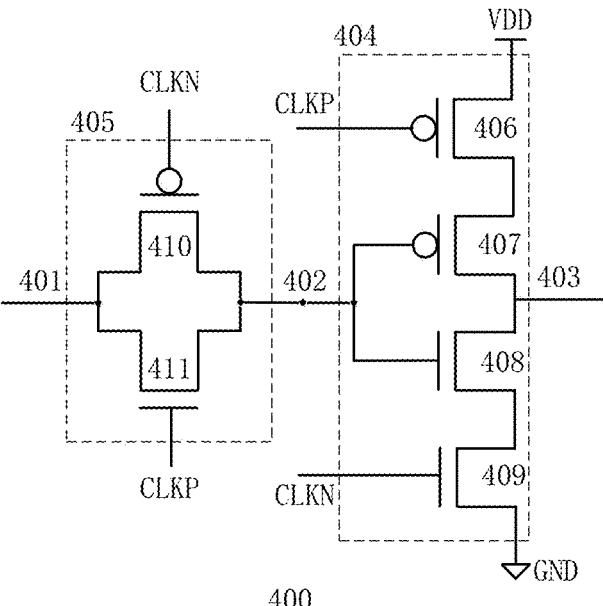
Figure 7:
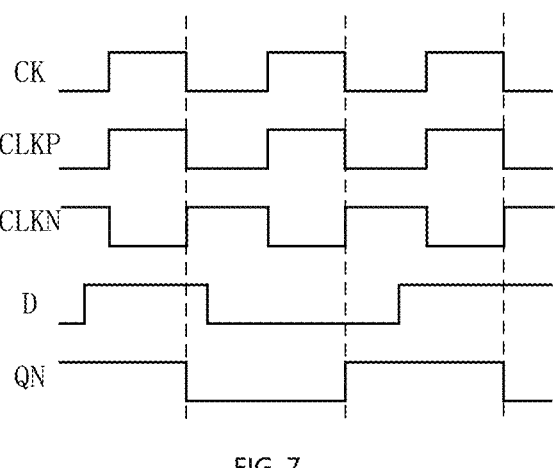
FIG. 7 shows a circuit time sequence diagram of the dynamic D flip-flops shown in FIG. 6A and FIG. 6B.

A dynamic D flip-flop which is active at falling edges may be realized by exchanging positions of the clock control signals of the dynamic D flip-flop. For example, for the circuit shown in FIG. 4A, the gate of the third PMOS transistor 410 of the first latch unit 405 is changed to be controlled by CLKN, the gate of the third NMOS transistor 411 of the first latch unit 405 is changed to be controlled by CLKP, the gate of the second PMOS transistor 407 of the second latch unit 404 is changed to be controlled by CLKP, and the gate of the first NMOS transistor 408 of the second latch unit 404 is changed to be controlled by CLKN, then the obtained circuit as a variant is shown in FIG. 6A. For the circuit shown in FIG. 4B, the gate of the third PMOS transistor 410 of the first latch unit 405 is changed to be controlled by CLKN, the gate of the third NMOS transistor 411 of the first latch unit 405 is changed to be controlled by CLKP, the gate of the first PMOS transistor 406 of the second latch unit 404 is changed to be controlled by CLKP, and the gate of the second NMOS transistor 409 of the second latch unit 404 is changed to be controlled by CLKN, then the obtained circuit as a variant is shown in FIG. 6B. FIG. 7 is a time sequence diagram of the dynamic D flip-flops which are active at falling edges shown in FIG. 6A and FIG. 6B.

As shown in FIG. 7, when CK is at a high level, CLKP is at a high level, and CLKN is at a low level. For the dynamic D flip-flops shown in FIG. 6A and FIG. 6B, in this case, the first latch unit 405 is in an on state, and the input data at the input terminal of the dynamic D flip-flop 400 is stored to the node 402 through the first latch unit 405. In this case, the transistors controlled by the clock signals CLKN and CLKP in the second latch unit 404 are in an off state, the second latch unit 404 is in a high-impedance state, and the data at the node 402 cannot pass through the second latch unit 404. The data at the node 403 can be latched at the node 403 to maintain the original state and play a role of data registering. In this case, the output of the dynamic D flip-flop 400 maintains the original state.

Subsequently, as shown in FIG. 7, when a falling edge of CK comes, CLKP jumps to a low level, and CLKN jumps to a high level. For the dynamic D flip-flops shown in FIG. 6A and FIG. 6B, in this case, the first latch unit 405 is in an off state, the input data at the input terminal cannot pass through the first latch unit 405, and the data at the node 402 maintains the original state. In this case, the transistors controlled by the clock signals CLKN and CLKP in the second latch unit 404 are in an on state, the second latch unit 404 is on, and transmits the data at the node 402 to the node 403 in an inverted manner and outputs it. It can be seen that when the falling edge of the clock signal CK comes, the output state of the dynamic D flip-flop changes. Due to an inverting effect of the second latch unit 404, the output data at the node 403 of the dynamic D flip-flop 400 is inverted from the input data at the node 401 of the dynamic D flip-flop 400. Therefore, as shown in FIG. 7, when the falling edge of CK comes, the output terminal QN jumps to 0 in a case that the input terminal D is 1, and the output terminal QN jumps to 1 in a case that the input terminal D is 0.

FIG. 8A to FIG. 8D show schematic circuit diagrams of dynamic D flip-flops according to some other embodiments of the present disclosure. Different from the dynamic D flip-flops including the first latch unit 405 as a transmission gate and the second latch unit 404 as a triple gate shown in FIG. 4A, FIG. 4B, FIG. 6A, and FIG. 6B, both the first latch unit 412 and the second latch unit 404 of the dynamic D flip-flops in the circuits shown in FIG. 8A to FIG. 8D may be triple gates.

Figure 8A:
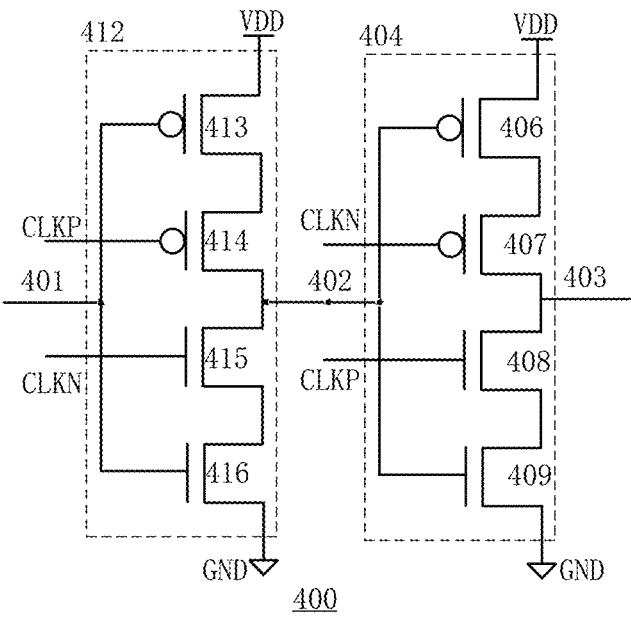
FIG. 8A to FIG. 8D respectively show schematic circuit diagrams of dynamic D flip-flops according to some other embodiments of the present disclosure.

FIG. 8A shows a schematic circuit diagram of a dynamic D flip-flop according to some embodiments of the present disclosure. The dynamic D flip-flop 400 may include a first latch unit 412 and a second latch unit 404. At a node 401 as an input terminal of the dynamic D flip-flop 400, the first latch unit 412 may receive input data; at a node 402 as an output terminal of the first latch unit 412, the first latch unit 412 may transmit data latched by the first latch unit 412 to the second latch unit 404; and at a node 403 as an output terminal of the second latch unit 404, the second latch unit 404 may provide output data.

In the embodiment shown in FIG. 8A, the first latch unit 412 may be a triple gate. As shown in FIG. 8A, the first latch unit 412 may include a fourth PMOS transistor 413, a fifth PMOS transistor 414, a fourth NMOS transistor 415, and a fifth NMOS transistor 416, wherein the fourth PMOS transistor 413, the fifth PMOS transistor 414, the fourth NMOS transistor 415, and the fifth NMOS transistor 416 are sequentially connected in series between a power supply VDD and ground GND.

As shown in FIG. 8A, a source of the fourth PMOS transistor 413 may be connected to the power supply VDD, a source of the fifth PMOS transistor 414 may be connected to a drain of the fourth PMOS transistor 413, a drain of the fourth NMOS transistor 415 may be connected to a drain of the fifth PMOS transistor 414, a drain of the fifth NMOS transistor 416 may be connected to a source of the fourth NMOS transistor 415, and a source of the fifth NMOS transistor 416 may be connected to the ground GND, wherein the drain of the fifth PMOS transistor 414 may be connected to the drain of the fourth NMOS transistor 415, to form an output terminal of the first latch unit 412. A gate of the fourth PMOS transistor 413 may be connected to a gate of the fifth NMOS transistor 416, to form the input terminal of the first latch unit 412 to receive input data from the input terminal, so that the gate of the fourth PMOS transistor 413 and the gate of the fifth NMOS transistor 416 can be controlled by the input data. A gate of the fifth PMOS transistor 414 may be controlled by the clock signal CLKP, and a gate of the fourth NMOS transistor 415 may be controlled by the clock signal CLKN.

When CLKN is at a low level, CLKP is at a high level, and both the fifth PMOS transistor 414 and the fourth NMOS transistor 415 are in an off state. In this case, the first latch unit 412 is in a high-impedance state, and the input data at the node 401 cannot pass through the first latch unit 412. When CLKN is at a high level, CLKP is at a low level, and both the fifth PMOS transistor 414 and the fourth NMOS transistor 415 are in an on state. In this case, the first latch unit 412 is in an on state, and transmits the input data at the node 401 to the node 402 in an inverted manner, to rewrite the data at the node 402.

Similarly, the second latch unit 404 may also be a triple gate. As shown in FIG. 8A, the second latch unit 404 may include a first PMOS transistor 406, a second PMOS transistor 407, a first NMOS transistor 408, and a second NMOS transistor 409, wherein the first PMOS transistor 406, the second PMOS transistor 407, the first NMOS transistor 408, and the second NMOS transistor 409 are sequentially connected in series between a power supply VDD and ground GND.

As shown in FIG. 8A, a source of the first PMOS transistor 406 may be connected to the power supply VDD, a source of the second PMOS transistor 407 may be connected to a drain of the first PMOS transistor 406, a drain of the first NMOS transistor 408 may be connected to a drain of the second PMOS transistor 407, a drain of the second NMOS transistor 409 may be connected to a source of the first NMOS transistor 408, and a source of the second NMOS transistor 409 may be connected to the ground GND, wherein the drain of the second PMOS transistor 407 may be connected to the drain of the first NMOS transistor 408, to form an output terminal of the second latch unit 404. A gate of the first PMOS transistor 406 may be connected to a gate of the second NMOS transistor 409, to form an input terminal of the second latch unit 404. The input terminal is connected to the output terminal of the first latch unit 412, so that the gate of the first PMOS transistor 406 and the gate of the second NMOS transistor 409 can be controlled by an output of the first latch unit 412. A gate of the second PMOS transistor 407 may be controlled by the clock signal CLKN, and a gate of the first NMOS transistor 408 may be controlled by the clock signal CLKP.

When CLKN is at a low level, CLKP is at a high level, and both the second PMOS transistor 407 and the first NMOS transistor 408 are in an on state. In this case, the second latch unit 404 is in an on state, and transmits the data at the node 402 to the node 403 in an inverted manner, to rewrite the data at the node 403. When CLKN is at a high level, CLKP is at a low level, and both the second PMOS transistor 407 and the first NMOS transistor 408 are in an off state. In this case, the second latch unit 404 is in a high-impedance state, and the data outputted by the first latch unit 412 at the node 402 cannot pass through the second latch unit 404. Because the data at the node 402 cannot pass through the second latch unit 404, the data at the node 402 can be latched at the node 402 to maintain the original state and play a role of data registering.

As shown in FIG. 8A, the output drive unit is omitted for the dynamic D flip-flop 400, and the output terminal of the dynamic D flip-flop 400 is configured to use data from the second latch unit 404 as output data for outputting. Due to an inverting effect of the first latch unit 412 and the second latch unit 404, the output data at the node 403 is in phase with the input data at the node 401 for the dynamic D flip-flop 400.

Compared with a conventional dynamic D flip-flop including the output drive unit, transistor(s) of the output drive unit is(are) omitted for the dynamic D flip-flop shown in FIG. 8A, and only 8 transistors are required. Although the quantity of transistors is larger than that of the dynamic D flip-flop shown in FIG. 4A, FIG. 4B, FIG. 6A, and FIG. 6B, the chip area can still be greatly reduced. Due to the reduction of one stage of inverter output stage, power consumption will also be reduced. The advantageous technical effect is also applicable to the dynamic D flip-flops shown in FIG. 8B to FIG. 8D below.

Figure 8B:
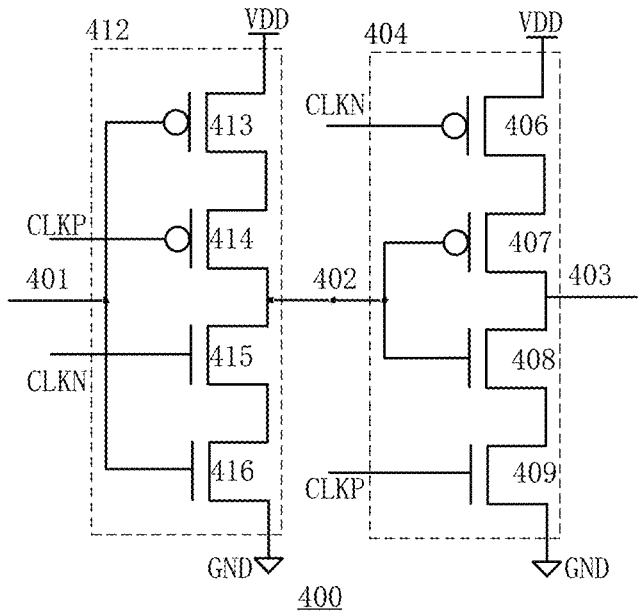

FIG. 8B shows a schematic circuit diagram of a dynamic D flip-flop as a variant of the dynamic D flip-flop shown in FIG. 8A.

The first latch unit 412 of the dynamic D flip-flop shown in FIG. 8B is the same as the first latch unit 412 of the dynamic D flip-flop shown in FIG. 8A, and details are not described herein again.

The difference between the second latch unit 404 of the dynamic D flip-flop shown in FIG. 8B and the second latch unit 404 of the dynamic D flip-flop shown in FIG. 8A lies in the controlling on the gates of the first PMOS transistor 406, the second PMOS transistor 407, the first NMOS transistor 408, and the second NMOS transistor 409. Specifically, in the second latch unit 404 of the dynamic D flip-flop shown in FIG. 8B, the gate of the second PMOS transistor 407 may be connected to the gate of the first NMOS transistor 408, to form the input terminal of the second latch unit 404, and the input terminal is connected to the output terminal of the first latch unit 405, so that the gate of the second PMOS transistor 407 and the gate of the first NMOS transistor 408 can be controlled by the output of the first latch unit 405; and the gate of the first PMOS transistor 406 can be controlled by the clock signal CLKN, and the gate of the second NMOS transistor 409 can be controlled by the clock signal CLKP.

When CLKN is at a low level, CLKP is at a high level, and both the first PMOS transistor 406 and the second NMOS transistor 409 are in an on state. In this case, the second latch unit 404 is in an on state, and transmits the data at the node 402 to the node 403 in an inverted manner, to rewrite the data at the node 403. When CLKN is at a high level, CLKP is at a low level, and both the first PMOS transistor 406 and the second NMOS transistor 409 are in an off state. In this case, the second latch unit 404 is in a high-impedance state, and the data outputted by the first latch unit 412 at the node 402 cannot pass through the second latch unit 404. Because the data at the node 402 cannot pass through the second latch unit 404, the data at the node 402 can be latched at the node 402 to maintain the original state and play a role of data registering.

Similar to the dynamic D flip-flop shown in FIG. 8A, the output data at the node 403 is in phase with the input data at the node 401 for the dynamic D flip-flop shown in FIG. 8B.

Figure 8C:
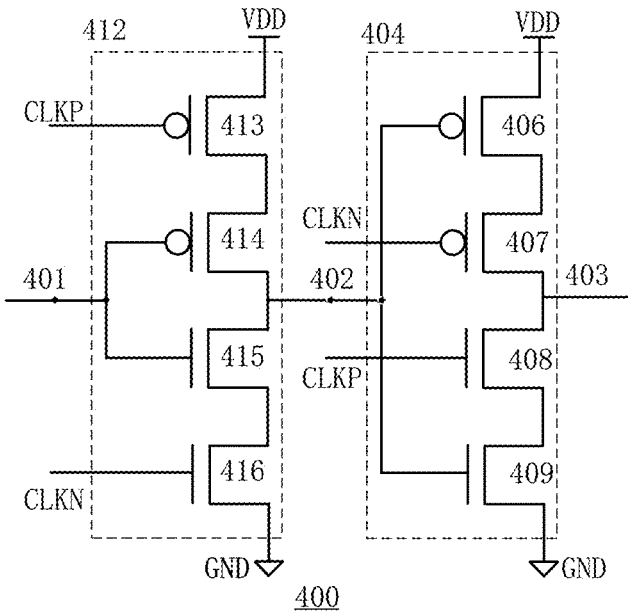

FIG. 8C shows a schematic circuit diagram of a dynamic D flip-flop as a variant of the dynamic D flip-flop shown in FIG. 8A.

The second latch unit 404 of the dynamic D flip-flop shown in FIG. 8C is the same as the second latch unit 404 of the dynamic D flip-flop shown in FIG. 8A, and details are not described herein again.

The difference between the first latch unit 412 of the dynamic D flip-flop shown in FIG. 8C and the first latch unit 412 of the dynamic D flip-flop shown in FIG. 8A lies in the controlling on the gates of the fourth PMOS transistor 413, the fifth PMOS transistor 414, the fourth NMOS transistor 415, and the fifth NMOS transistor 416. Specifically, in the first latch unit 412 of the dynamic D flip-flop shown in FIG. 8C, the gate of the fifth PMOS transistor 414 may be connected to the gate of the fourth NMOS transistor 415, to form the input terminal of the first latch unit 412 to receive input data from the input terminal, so that the gate of the fifth PMOS transistor 414 and the gate of the fourth NMOS transistor 415 can be controlled by the input data; and the gate of the fourth PMOS transistor 413 can be controlled by the clock signal CLKP, and the gate of the fifth NMOS transistor 416 can be controlled by the clock signal CLKN.

When CLKN is at a low level, CLKP is at a high level, and both the fourth PMOS transistor 413 and the fifth NMOS transistor 416 are in an off state. In this case, the first latch unit 412 is in a high-impedance state, and the input data at the node 401 cannot pass through the first latch unit 412. When CLKN is at a high level, CLKP is at a low level, and both the fourth PMOS transistor 413 and the fifth NMOS transistor 416 are in an on state. In this case, the first latch unit 412 is in an on state, and transmits the input data at the node 401 to the node 402 in an inverted manner, to rewrite the data at the node 402.

Similar to the dynamic D flip-flop shown in FIG. 8A, the output data at the node 403 is in phase with the input data at the node 401 for the dynamic D flip-flop shown in FIG. 8C.

Figure 8D:
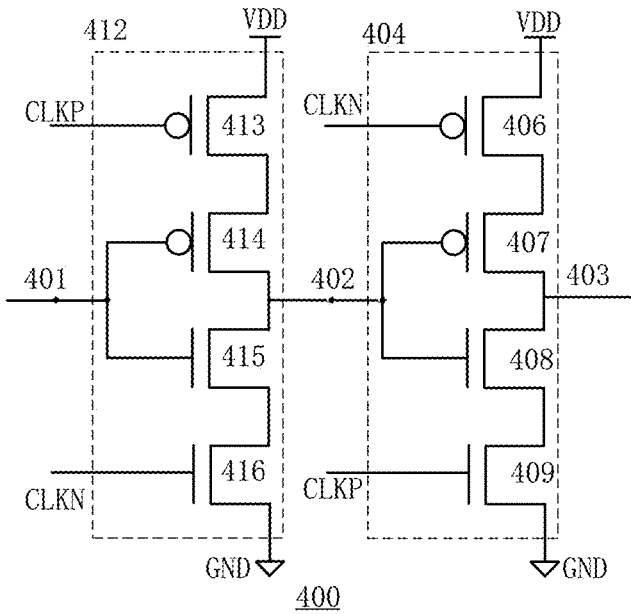

FIG. 8D shows a schematic circuit diagram of a dynamic D flip-flop as a variant of the dynamic D flip-flop shown in FIG. 8A.

The first latch unit 412 of the dynamic D flip-flop shown in FIG. 8D is the same as the first latch unit 412 of the dynamic D flip-flop shown in FIG. 8C, and details are not described herein again.

The second latch unit 404 of the dynamic D flip-flop shown in FIG. 8D is the same as the second latch unit 404 of the dynamic D flip-flop shown in FIG. 8B, and details are not described herein again.

Similar to the dynamic D flip-flop shown in FIG. 8A, the output data at the node 403 is in phase with the input data at the node 401 for the dynamic D flip-flop shown in FIG. 8D.

Figure 9:
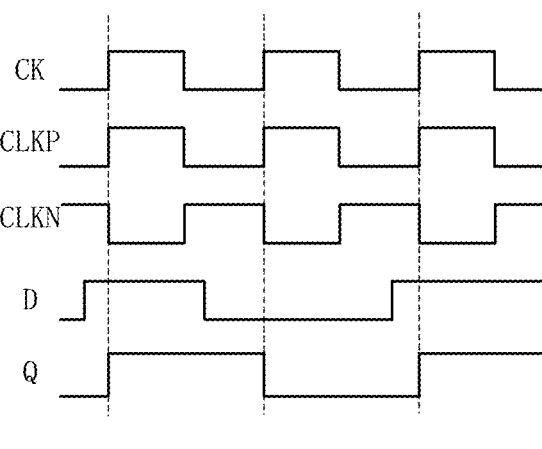
FIG. 9 shows a circuit time sequence diagram of the dynamic D flip-flops shown in FIG. 8A to FIG. 8D.

FIG. 9 is a circuit time sequence diagram of the dynamic D flip-flops shown in FIG. 8A to FIG. 8D.

In the dynamic D flip-flops shown in FIG. 8A to FIG. 8D, when CK is at a low level, CLKP is at a low level, and CLKN is at a high level. For the dynamic D flip-flops shown in FIG. 8A to FIG. 8D, in this case, the first latch unit 412 is in an on state, and inverts the input data at the input terminal of the dynamic D flip-flop 400 and stores it to the node 402. In this case, the transistors controlled by the clock signals CLKN and CLKP in the second latch unit 404 are in an off state, the second latch unit 404 is in a high-impedance state, and the data at the node 402 cannot pass through the second latch unit 404. The data at the node 403 can be latched at the node 403 to maintain the original state and play a role of data registering. In this case, the output of the dynamic D flip-flop 400 maintains the original state.

Subsequently, when a rising edge of CK comes, CLKP jumps to a high level, and CLKN jumps to a low level. For the dynamic D flip-flops shown in FIG. 8A to FIG. 8D, in this case, the first latch unit 412 is in a high-impedance state, the input data at the input terminal cannot pass through the first latch unit 412, and the data at the node 402 maintains the original state. In this case, the transistors controlled by the clock signals CLKN and CLKP in the second latch unit 404 are in an on state, the second latch unit 404 is on and plays a role of inverting the data at the input terminal thereof, to transmit the data at the node 402 to the node 403 in an inverted manner and output the data. It can be seen that when the rising edge of the clock signal CK comes, the output state of the dynamic D flip-flop changes. Due to an inverting effect of the first latch unit 412 and the second latch unit 404, the output data at the node 403 of the dynamic D flip-flop 400 is in phase with the input data at the node 401 of the dynamic D flip-flop 400. Therefore, when the rising edge of CK comes, the output terminal Q jumps to 1 in a case that the input terminal D is 1, and the output terminal Q jumps to 0 in a case that the input terminal D is 0.

Dynamic D flip-flops which are active at falling edges may be realized by exchanging positions of the clock control signals of the dynamic D flip-flops which are active at rising edges shown in FIG. 8A to FIG. 8D, which is similar to realizing the dynamic D flip-flops which are active at falling edges shown in FIG. 6A and FIG. 6B by exchanging positions of the clock control signals of the dynamic D flip-flops which are active at rising edges shown in FIG. 4A and FIG. 4B described above. Details are not described herein again.

Figure 10:
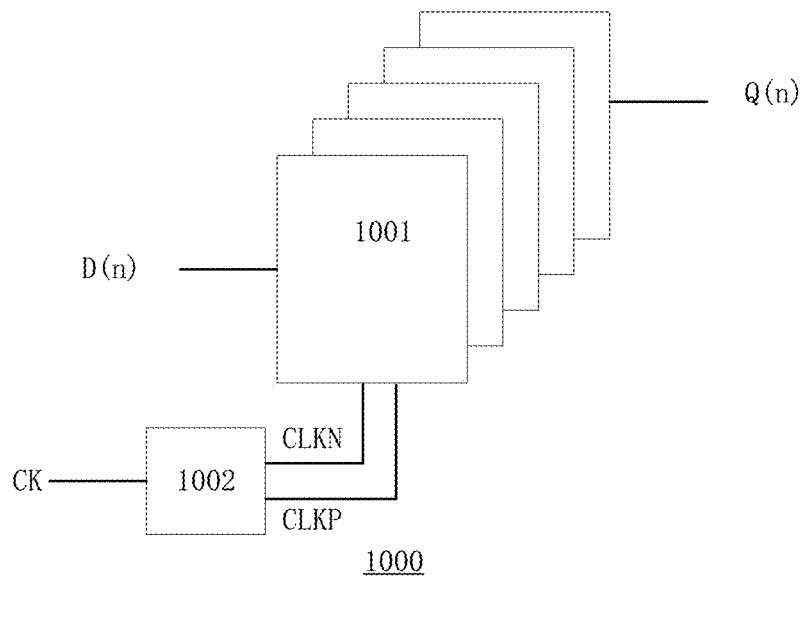
FIG. 10 shows a register including a plurality of dynamic D flip-flops connected in parallel.

FIG. 10 shows a register including a plurality of dynamic D flip-flops connected in parallel according to embodiment (s) of the present disclosure. As shown in FIG. 10, a register 1000 includes a plurality of dynamic D flip-flops 1001 connected in parallel, a clock buffer 1002, a clock signal terminal CK, a plurality of input terminals D(n), and a plurality of output terminals Q(n), wherein n represents n channels of input/outputs. The plurality of input terminals D(n) are configured to receive input data; the plurality of output terminals Q(n) are configured to output data; the clock signal terminal CK is configured to receive an external clock signal; and the clock buffer 1002 is configured to provide control clock signals to the plurality of dynamic D flip-flops based on the external clock signal, wherein the control clock signals includes clock signals CLKP and CLKN, the clock signal CLKP is inverted from the clock signal CLKN, and the plurality of dynamic D flip-flops 1001 are connected in parallel between the plurality of input terminals and the plurality of output terminals, and configured to latch and/or read data under control of the control clock signals, wherein the dynamic D flip-flop 1001 is the dynamic D flip-flop according to the embodiments of the present disclosure with reference to FIG. 1 to FIG. 9.

An independent D flip-flop usually needs a clock buffer to generate mutually inverted clock signals to control the D flip-flop. If an independent clock buffer is configured for each D flip-flop, the clock buffer will consume a considerable chip area and power in an application that needs to use a plurality of D flip-flops. To resolve this problem, one clock buffer in the present disclosure simultaneously drives a plurality of dynamic D flip-flops, which can effectively reduce the area and power consumption. Compared with a conventional register, the register as claimed in the present disclosure further has the advantages of reduced area and reduced power.

The present disclosure further provides a bitcoin mining algorithm apparatus, including the dynamic D flip-flop described above or the register using the dynamic D flip-flop described above.

In all examples that are shown and discussed herein, any specific value should be interpreted only as an example and not as a limitation. Therefore, other examples of the exemplary embodiments may have different values.

The words "front", "rear", "top", "bottom", "above", "under" and the like in the description and the claims, if present, are used for a descriptive purpose and are not necessarily used for describing the unchanged relative position. It should be understood that the words used in such a way are interchangeable in proper circumstances so that the embodiments of the present disclosure described herein, for example, can be operated in other orientations that are different from those shown herein or those described otherwise.

As used herein, the word "exemplary" means "serving as an example, instance, or illustration" rather than as a "model" to be exactly reproduced. Any implementation exemplarily described herein is not necessarily to be explained as preferable or advantageous over other implementations. Furthermore, the present disclosure is not limited by any expressed or implied theory provided in the foregoing technical field, background, summary, or detailed description.

It should be further understood that the word "comprise/include/comprising/including/comprising", when used herein, specifies the presence of stated features, integers, steps, operations, units, and/or components, but do not preclude the presence or addition of one or more other features, integers, steps, operations, units, and/or components, and/or combinations thereof.

In addition, in the description of the present disclosure, the terms such as "first", "second", and "third" are used for the purpose of description only and are not to be construed as indicating or implying relative importance and a relative sequence.

One skilled in the art should be aware that, the boundaries between the foregoing operations are merely illustrative. A plurality of operations may be combined into a single operation, a single operation may be distributed among additional operations, and operations may be temporally performed with at least partial overlap. In addition, alternative embodiments may include a plurality of instances of a particular operation, and an operation order may be changed in other various embodiments. However, other modifications, changes, and replacements may also exist. Therefore, the description and accompanying drawings are to be regarded as illustrative rather than limitative.

Although some particular embodiments of the present disclosure have been described in detail based on examples, one skilled in the art should understand that the above examples are for illustration only, and are not intended to limit the scope of the present disclosure. The embodiments disclosed herein may be combined arbitrarily without departing from the spirit and scope of the present disclosure. One skilled in the art should further understand that, a plurality of modifications may be made to the embodiments without departing from the scope and spirit of the present disclosure. The scope of the present disclosure is limited by the appended claims.

What is claimed is:

1. A dynamic D flip-flop, comprising:
an input terminal, configured to receive input data;
an output terminal, configured to provide output data in response to the input data;
clock signal terminal(s), configured to receive clock signal(s);
a first latch unit, configured to latch the input data from the input terminal and transmit the input data under control of the clock signal(s); and
a second latch unit, configured to latch data from the first latch unit and transmit the data latched by the first latch unit under control of the clock signal(s),
wherein the first latch unit and the second latch unit are sequentially connected in series between the input terminal and the output terminal,
wherein the second latch unit is a triple gate and an output of the second latch unit is used as the output terminal for driving a load of the dynamic D flip-flop, wherein the output of the second latch unit is not connected with an inverter which is used as an output drive unit, and
wherein the output terminal is configured to provide the output data which is inverted from the input data by directly outputting the data transmitted by the first latch unit and transmitted by the second latch unit, which is not inverted by the first latch unit but is inverted by the second latch unit, as the output data of the dynamic D flip-flop.

2. The dynamic D flip-flop according to claim 1, wherein the second latch unit comprises a first PMOS transistor, a second PMOS transistor, a first NMOS transistor, and a second NMOS transistor, and the first PMOS transistor, the second PMOS transistor, the first NMOS transistor, and the second NMOS transistor of the second latch unit are sequentially connected in series between a power supply and ground.

3. The dynamic D flip-flop according to claim 2, wherein the clock signal(s) comprises a first clock signal and a second clock signal, and the first clock signal is inverted from the second clock signal.

4. The dynamic D flip-flop according to claim 3, wherein the first latch unit is a transmission gate.

5. The dynamic D flip-flop according to claim 4, wherein the transmission gate comprises a third PMOS transistor and a third NMOS transistor, and the third PMOS transistor and the third NMOS transistor are connected in parallel between the input terminal of the dynamic D flip-flop and an output terminal of the transmission gate.

6. The dynamic D flip-flop according to claim 5, wherein
a gate of the third PMOS transistor of the first latch unit and a gate of the first NMOS transistor of the second latch unit are controlled by the first clock signal,
a gate of the third NMOS transistor of the first latch unit and a gate of the second PMOS transistor of the second latch unit are controlled by the second clock signal, and
a gate of the first PMOS transistor of the second latch unit and a gate of the second NMOS transistor of the second latch unit are controlled by an output of the first latch unit.

7. The dynamic D flip-flop according to claim 5, wherein
a gate of the third PMOS transistor of the first latch unit and a gate of the second NMOS transistor of the second latch unit are controlled by the first clock signal,
a gate of the third NMOS transistor of the first latch unit and a gate of the first PMOS transistor of the second latch unit are controlled by the second clock signal, and
a gate of the second PMOS transistor of the second latch unit and a gate of the first NMOS transistor of the second latch unit are controlled by an output of the first latch unit.

8. The dynamic D flip-flop according to claim 3, wherein the dynamic D flip-flop further comprises a clock buffer, and the clock buffer is configured to generate the first clock signal and the second clock signal based on an external clock signal, wherein the first clock signal is in phase with or inverted from the external clock signal.

9. A chip, comprising the dynamic D flip-flop according to claim 1.

10. A data processing apparatus, configured to execute a digital currency encryption algorithm, and comprising the chip according to claim 9.

11. A register, comprising:
a plurality of input terminals, configured to receive input data;
a plurality of output terminals, configured to output data;

a clock signal terminal, configured to receive an external clock signal; and a clock buffer, configured to provide control clock signals to a plurality of dynamic D flip-flops based on the external clock signal, wherein the control clock signals comprises a first clock signal and a second clock signal, the first clock signal is inverted from the second clock signal, and the plurality of dynamic D flip-flops are connected in parallel between the plurality of input terminals and the plurality of output terminals, and configured to perform at least one of latching or reading of data under control of the control clock signals, wherein the dynamic D flip-flop is the dynamic D flip-flop according to claim 1.

12. The register according to claim 11, wherein the first clock signal is in phase with or inverted from the external clock signal.

13. A chip, comprising the register according to claim 11.

\*  \*  \*  \*  \*